(12) United States Patent
Cho et al.

(10) Patent No.: US 7,563,726 B2
(45) Date of Patent: Jul. 21, 2009

(54) SEMICONDUCTOR DEVICE WITH MULTIPLE GATE DIELECTRIC LAYERS AND METHOD FOR FABRICATING THE SAME

(75) Inventors: Heung-Jae Cho, Ichon-shi (KR); Kwan-Yong Lim, Ichon-shi (KR); Seung-Ryong Lee, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 342 days.

(21) Appl. No.: 11/227,156

(22) Filed: Sep. 16, 2005

(65) Prior Publication Data
US 2006/0138550 A1 Jun. 29, 2006

(30) Foreign Application Priority Data
Dec. 29, 2004 (KR) .................. 10-2004-0115352

(51) Int. Cl.
*H01L 21/31* (2006.01)
(52) U.S. Cl. ............... 438/769; 438/775; 257/E21.267; 257/E21.268; 257/E21.639
(58) Field of Classification Search .......... 257/E21.637, 257/E21.684, 369, E21.267, E21.268, E21.639; 438/775, 769
See application file for complete search history.

(56) References Cited

U.S. PATENT DOCUMENTS

| | | | | |
|---|---|---|---|---|
| 5,834,351 A * | 11/1998 | Chang et al. | ................ | 438/266 |
| 6,368,923 B1 * | 4/2002 | Huang | ........................ | 438/275 |
| 6,436,771 B1 | 8/2002 | Jang et al. | | |
| 6,468,838 B2 * | 10/2002 | Chien et al. | .................. | 438/142 |
| 6,528,434 B2 * | 3/2003 | Chen | .......................... | 438/787 |
| 6,597,046 B1 * | 7/2003 | Chau et al. | .................. | 257/411 |
| 6,653,184 B2 | 11/2003 | Moore | | |

(Continued)

FOREIGN PATENT DOCUMENTS

KR    10 2002 042487    6/2002

(Continued)

OTHER PUBLICATIONS

Notice of Preliminary Rejection issued on May 10, 2006, by the Korean Intellectual Property Office in counterpart Korean Application No. 2004-0115352 and English translation thereof.

(Continued)

*Primary Examiner*—W. David Coleman
*Assistant Examiner*—Latanya Crawford
(74) *Attorney, Agent, or Firm*—Finnegan, Henderson, Farabow, Garrett & Dunner, L.L.P.

(57) ABSTRACT

Disclosed are a semiconductor device with dual gate dielectric layers and a method for fabricating the same. The semiconductor device includes: a silicon substrate divided into a cell region where NMOS transistors are formed and a peripheral region where NMOS and PMOS transistors are formed; a targeted silicon oxide layer formed on the silicon substrate in the cell region; an oxynitride layer formed on the silicon substrate in the peripheral region; a first gate structure formed in the cell region; a second gate structure formed on the oxynitride layer in an NMOS region of the peripheral region; and a third gate structure formed on the oxynitride layer in a PMOS region of the peripheral region.

7 Claims, 9 Drawing Sheets

U.S. PATENT DOCUMENTS

| | | | |
|---|---|---|---|
| 6,756,635 B2 * | 6/2004 | Yasuda et al. | 257/325 |
| 6,780,715 B2 | 8/2004 | Jeong | |
| 6,784,060 B2 * | 8/2004 | Ryoo | 438/275 |
| 6,828,185 B2 | 12/2004 | Lim et al. | |
| 6,872,664 B2 * | 3/2005 | Wu | 438/699 |
| 7,078,354 B2 * | 7/2006 | Kanda | 438/770 |
| 2004/0029328 A1 | 2/2004 | Lahaug | |
| 2004/0092133 A1 * | 5/2004 | Hyun et al. | 438/787 |
| 2004/0232516 A1 * | 11/2004 | Yoneda | 257/510 |
| 2005/0164444 A1 * | 7/2005 | Burnham et al. | 438/232 |
| 2005/0205939 A1 * | 9/2005 | Lee et al. | 257/371 |

FOREIGN PATENT DOCUMENTS

| | | |
|---|---|---|
| KR | 2003-0050680 A | 6/2003 |
| KR | 2003-0093713 A | 12/2003 |
| KR | 2004-0077969 | 9/2004 |
| KR | 10 2004 108488 | 12/2004 |

OTHER PUBLICATIONS

First Office Action from the State Intellectual Property Office of the People's Republic of China dated Sep. 14, 2007 in counterpart Chinese patent application No. 200510076926.X.

"Effects of boron penetration and resultant limitations in ultra thin pure-oxide and nitrided-oxide gate-films", Morimoto et al., IEDM, pp. 429-432, 1990.

Office Action from the Taiwanese Intellectual Property Office, dated Jan. 9, 2008, in counterpart Taiwanese Application No. 094118197.

Office Action from the Chinese Patent Office mailed Nov. 28, 2008, in Chinese Patent Application No. 200510076926.X, and English translation thereof.

* cited by examiner

SEMICONDUCTOR DEVICE WITH MULTIPLE GATE DIELECTRIC LAYERS AND METHOD FOR FABRICATING THE SAME

The present application claims the benefit of priority to the Korean patent application No. KR 2004-0115352, filed in the Korean Patent Office on Dec. 29, 2004, the entire contents of which are incorporated herein by reference.

TECHNICAL FIELD

The present invention relates to a semiconductor device and method for fabricating the same, and, more particularly, to a semiconductor device and method for forming multiple gate dielectric layers in a semiconductor device.

BACKGROUND

Recently, there has been an active study on a system-on-chip (SOC) in which various devices with different functions have been integrated into one chip. For example, a thick gate dielectric layer is required for devices applied with high voltages to improve reliability, and a thin gate dielectric layer is required for devices sensitive to operation speed. Also, a dual polysilicon gate structure has been studied to improve the device operation speed and to get an N-channel metal oxide semiconductor field effect transistor (NMOSFET) and a P-channel metal oxide semiconductor field effect transistor (PMOSFET) to have a symmetric threshold voltage.

Figure 1A:
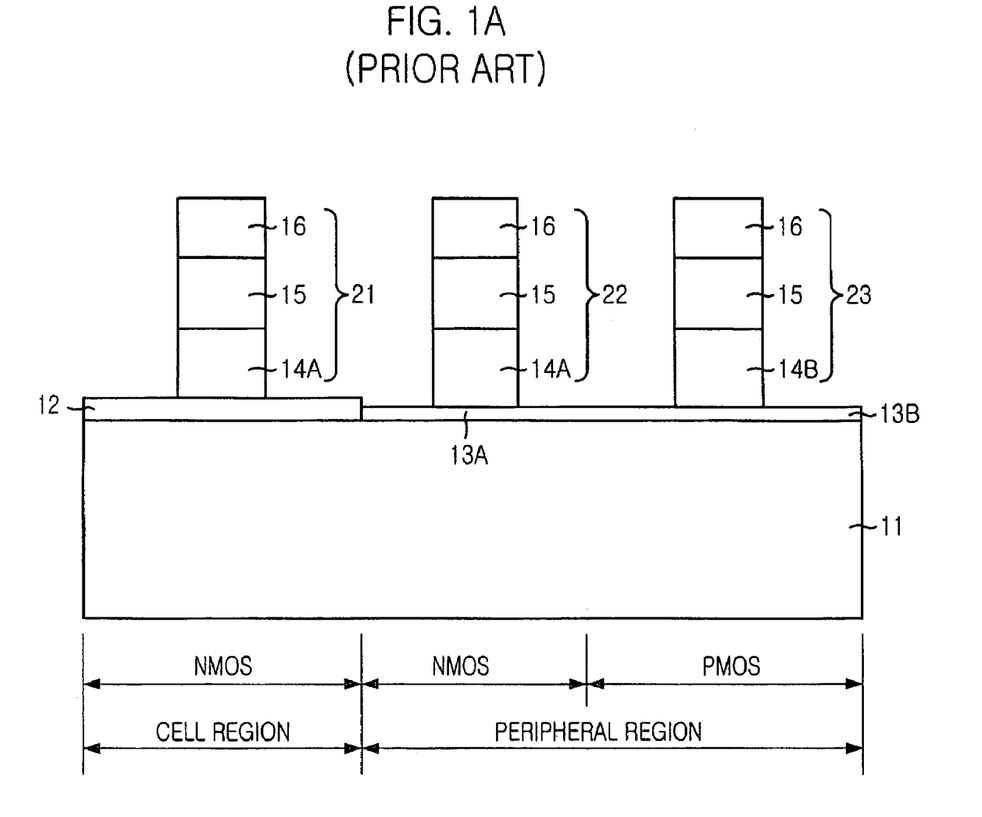
FIG. 1A is a cross-sectional view showing a conventional semiconductor device with multiple gate dielectric layers.

FIG. 1A is a diagram showing a structure of a conventional semiconductor device with a dual gate dielectric layer.

As shown in FIG. 1A, a silicon substrate 11 is divided into a cell region in which NMOS transistors will be formed and a peripheral region in which NMOS transistors and PMOS transistors will be formed. A first gate dielectric layer 12 is formed on the silicon substrate 11 disposed in the cell region, and a second gate dielectric layer 13A is formed on the silicon substrate 11 disposed in a region of the peripheral region where NMOS transistors will be formed. Also, a third gate dielectric layer 13B is formed on the silicon substrate 11 disposed in a region of the peripheral region where PMOS transistors will be formed.

A first gate structure 21 including an n+-type silicon electrode 14A, a low dielectric metal electrode 15 and a gate hard mask 16 is formed on the first gate dielectric layer 12 in the cell region. In the peripheral region, a second gate structure 22 including the n+-type silicon electrode 14A, the low dielectric metal electrode 15 and the gate hard mask 16 is formed on the second insulation layer 13A. Also, a third gate dielectric layer 13B including a p+-type silicon electrode 14B, the low dielectric metal electrode 15 and the gate hard mask 16 is formed on the third gate dielectric layer 13B in the peripheral region.

Herein, the first gate dielectric layer 12 formed in the cell region is thicker than the second and the third gate dielectric layers 13A and 13B formed in the peripheral region. Also, the first and the second gate dielectric layers 12 and 13A are silicon oxide ($SiO_2$) layers formed by employing a thermal oxidation process, while the third gate dielectric layer 13B is a nitride layer.

However, there are several difficulties in forming the first to the third gate dielectric layers with different thicknesses in one chip. First, it is complicated to form the gate dielectric layers 12, 13A and 13B with different thicknesses in different regions through employing a thermal process. Second, the gate dielectric layer 13B formed beneath the $P^+$-type silicon electrode 14B of the PMOS transistor in the peripheral region should be made of nitride instead of oxide in order to prevent penetration of boron. When the gate dielectric layer 13B is made of nitride, nitrogen exists at an interface between the gate dielectric layer 13B and the silicon substrate 11. The nitrogen existing at the interface results in a decrease in mobility of carriers which further causes a device speed to decrease.

Figure 1B:
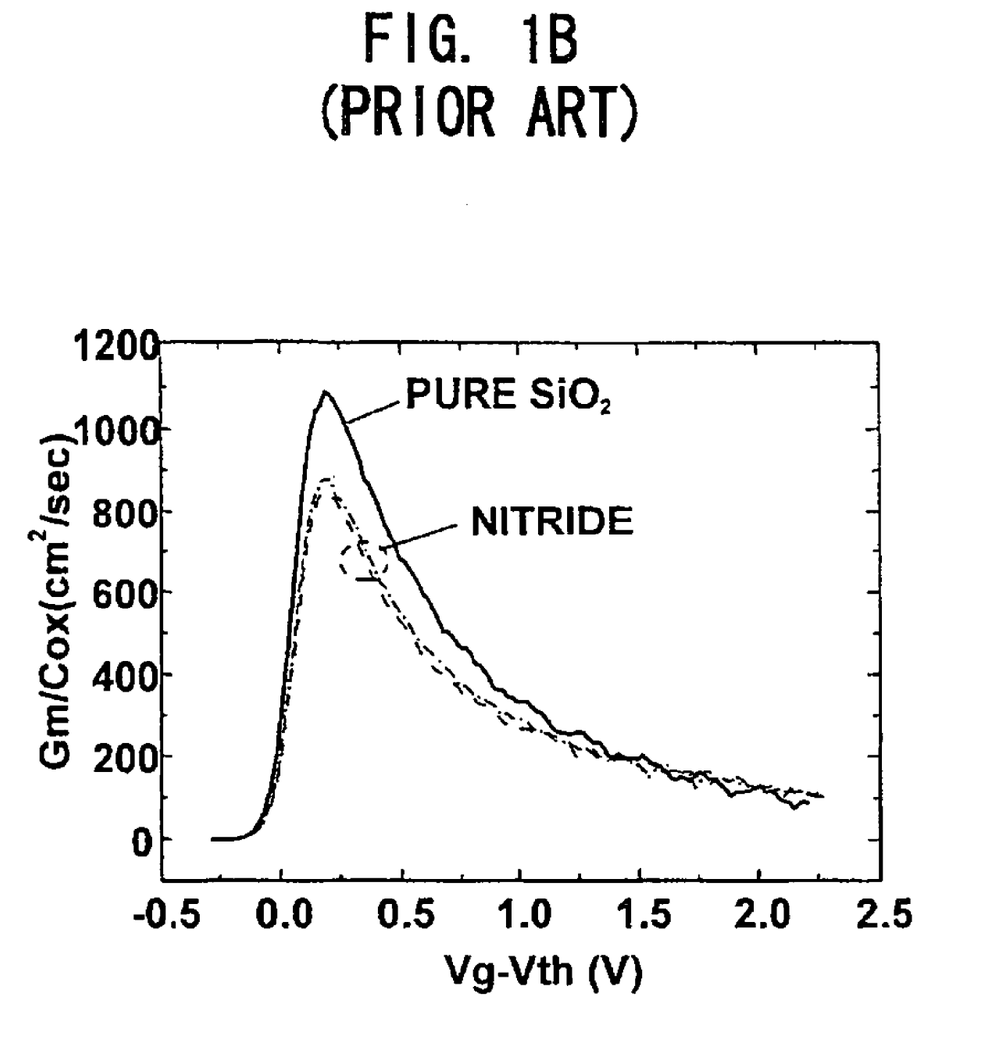
FIG. 1B is a graph for comparing a normalized transconductance characteristic of a pure silicon oxide layer with that of a nitride layer.

FIG. 1B is a graph for comparing normalized transconductance (Gm) of pure silicon oxide with that of nitride.

As shown in FIG. 1B, the nitride has a lower transconductance level than the pure silicon oxide. Generally, it is known that as the transconductance level, which is one parameter for representing a transistor characteristic, is higher, the transistor characteristic becomes better.

SUMMARY

Consistent with embodiments of the present invention, there is provided a semiconductor memory device, including: a silicon substrate including a cell region where NMOS transistors are formed and a peripheral region where NMOS and PMOS transistors are formed; a targeted silicon oxide layer on the silicon substrate in the cell region; an oxynitride layer on the silicon substrate in the peripheral region; a first gate structure formed on the targeted silicon layer and including an n+-type silicon electrode, a low resistance metal electrode, and a gate hard mask; a second gate structure formed on the oxynitride layer in an NMOS region of the peripheral region and including an n+-type silicon electrode, a low resistance metal electrode, and a gate hard mask; and a third gate structure formed on the oxynitride layer in a PMOS region of the peripheral region and including a p+-type silicon electrode, a low resistance metal electrode, and a gate hard mask.

Also consistent with embodiments of the present invention, there is provided a method for fabricating a semiconductor device, including: forming a silicon oxide layer on a silicon substrate through a first oxidation process, the silicon substrate including a cell region where NMOS transistors are formed and a peripheral region where NMOS and PMOS transistors are formed; selectively removing the silicon oxide layer in the peripheral region; simultaneously forming silicon-nitrogen bonds on an exposed surface of the silicon substrate in the peripheral region and silicon-oxygen-nitrogen bonds on a surface of the silicon oxide layer remaining in the cell region; and forming an oxynitride layer on the surface of the silicon substrate with the silicon-nitrogen bonds and transforming the remaining silicon oxide layer with the silicon-oxygen-nitrogen bonds into a targeted silicon oxide layer through performing a second oxidation process.

BRIEF DESCRIPTION OF THE DRAWINGS

The above and other features consistent with the present invention will become better understood with respect to the following description of the embodiments given in conjunction with the accompanying drawings, in which.

DETAILED DESCRIPTION

A semiconductor device with multiple gate dielectric layers and a method for fabricating the same consistent with the present invention will be described in detail with reference to the accompanying drawings.

Figure 2:
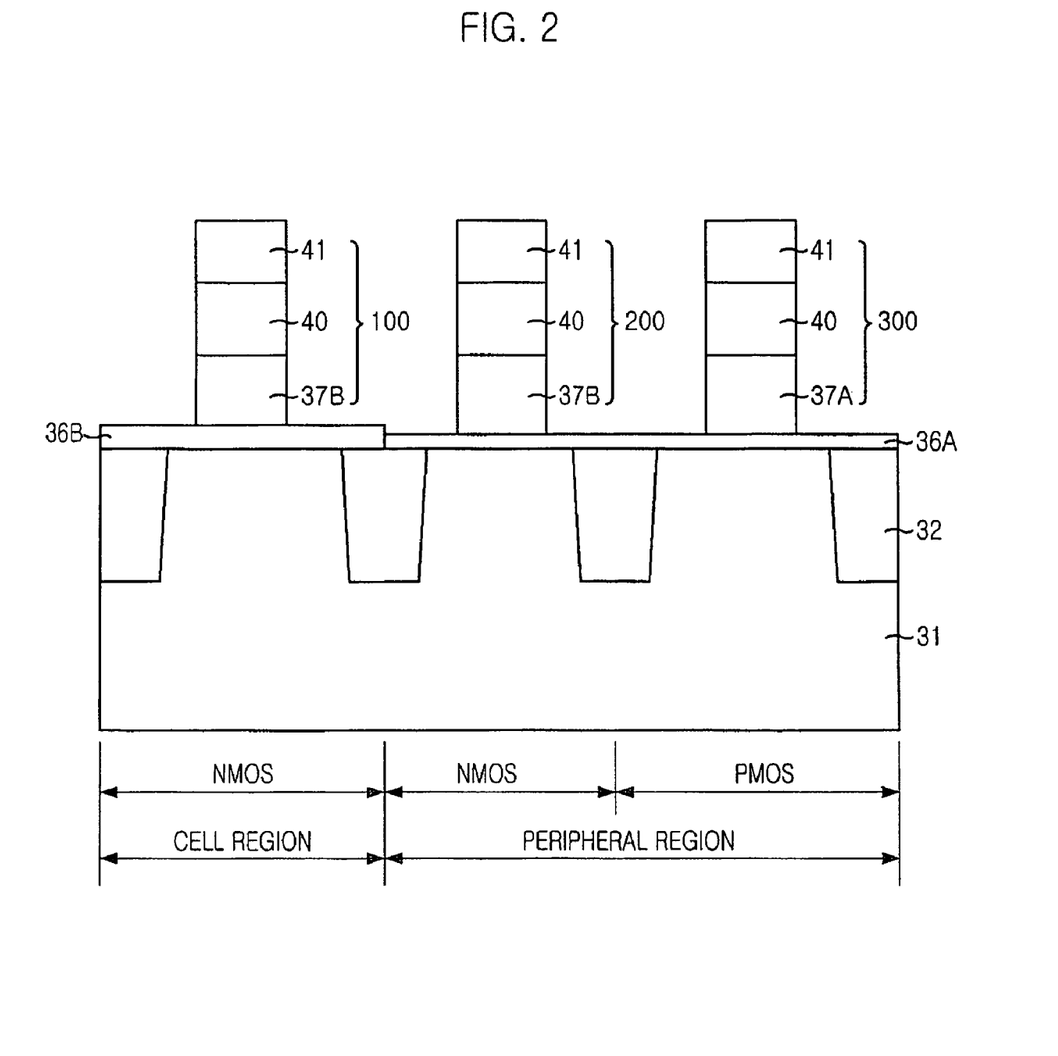
FIG. 2 is a cross-sectional view showing a semiconductor device with multiple gate dielectric layers consistent with the present invention.

FIG. 2 is a cross-sectional view showing a semiconductor device having multiple gate dielectric layers consistent with the present invention.

AS shown in FIG. 2, a silicon substrate 31 is divided into a cell region in which N-channel metal oxide semiconductor (NMOS) transistors will be formed and a peripheral region in which P-channel metal oxide semiconductor (PMOS) transistors and NMOS transistors will be formed. In the cell region where the NMOS transistors will be formed, a targeted silicon oxide layer 36B is formed on the silicon substrate 31. In the peripheral region where the NMOS and PMOS transistors will be formed, an oxynitride layer 36A is formed.

A first gate structure 100 including an n+-type silicon layer 37B, a low resistance metal electrode 40 and a gate hard mask 41 is formed on the targeted silicon oxide layer 36B in the cell region. Also, a second gate structure 200 including the n+-type silicon layer 37B, the low resistance metal electrode 40 and the gate hard mask 41 is formed on the oxynitride layer 36A in an NMOS region of the peripheral region. A third gate structure 300 including a p+-type silicon electrode 37A, the low resistance metal electrode 40 and the gate hard mask 41 is formed on the oxynitride layer 36A in a PMOS region of the peripheral region.

In the semiconductor device shown in FIG. 2, the targeted silicon oxide layer 36B in the cell region is thicker than the oxynitride layer 36A in the peripheral region. Also, the oxynitride layer 36A is formed by oxidizing a surface portion of the silicon substrate 31 where silicon-nitrogen bonds are formed. On the other hand, the targeted silicon oxide layer 36B is formed by oxidizing a silicon oxide layer where silicon-oxygen-nitrogen bonds are formed. Furthermore, the oxynitride layer 36A contains nitrogen of a concentration ranging in atomic percent from approximately 5% to approximately 30%.

FIGS. 3A to 3G are cross-sectional views illustrating a method for fabricating a semiconductor device with multiple gate dielectric layers consistent with the present invention. It should be noted that the same reference numerals are used for the same configuration elements described in FIG. 2.

Figure 3A:
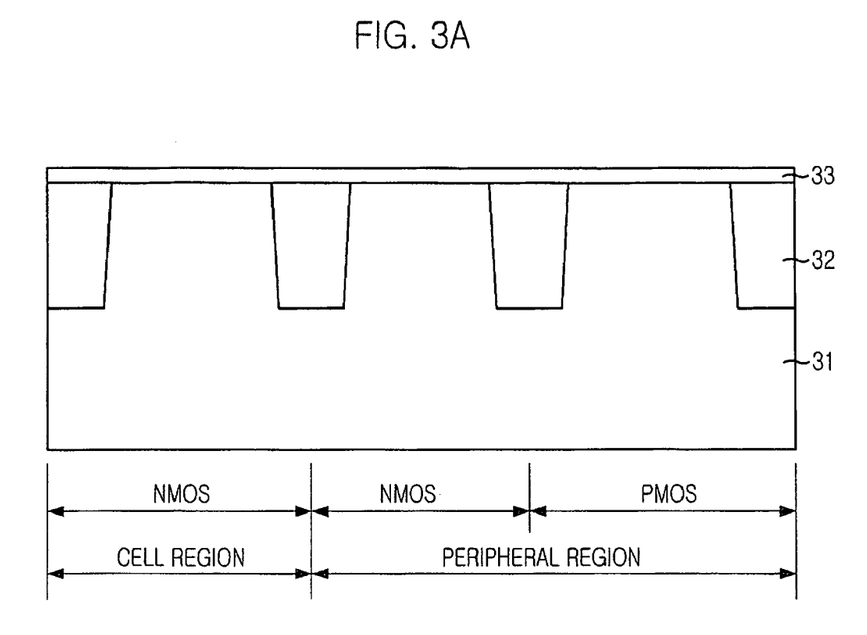
FIGS. 3A to 3G are cross-sectional views illustrating a method for fabricating a semiconductor device with multiple gate dielectric layers consistent with the present invention.

Referring to FIG. 3A, a first silicon oxide layer 33 is formed on a silicon substrate 31 provided with a field oxide layer 32 through performing a first oxidation process. That is, the first silicon oxide layer 33 is obtained by oxidizing a surface of the silicon substrate 31. Herein, the silicon substrate 31 is divided into a cell region and a peripheral region. Particularly, it is required to form a thick gate dielectric layer in the cell region, while it is required to form a relatively thin gate dielectric layer in the peripheral region. In a dynamic random access memory (DRAM) device, NMOS transistors will be formed in the cell region, while NMOS and PMOS transistors will be formed in the peripheral region. Also, as shown in FIG. 3A, the thickness of the first silicon oxide layer 33 in the cell region and in the peripheral region is the same. At this time, the first silicon oxide layer 33 has a thickness ranging from approximately 5 Å to approximately 100 Å.

Figure 3B:
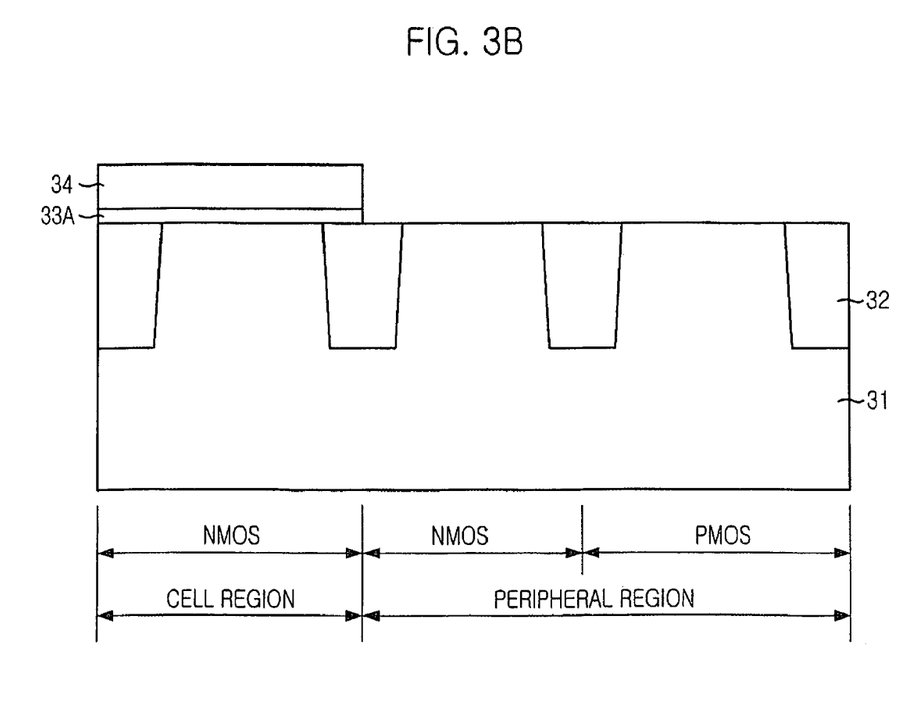

Referring to FIG. 3B, a photosensitive layer is formed on the first silicon oxide layer 33 and is patterned by performing a photo-exposure process and a developing process to form a first mask pattern 34 for masking the cell region. Afterwards, the first silicon oxide layer 33 formed in the peripheral region is etched by using the first mask pattern 34 as an etch barrier and as a result of this etching, a surface of the silicon substrate 31 in the peripheral region is exposed. A reference numeral 33A denotes a portion of first silicon oxide layer 33 remaining in the cell region after the above selective etching process. In the peripheral region, after the above selective etching process, the first silicon oxide layer 33 does not remain on the silicon substrate 31.

Figure 3C:
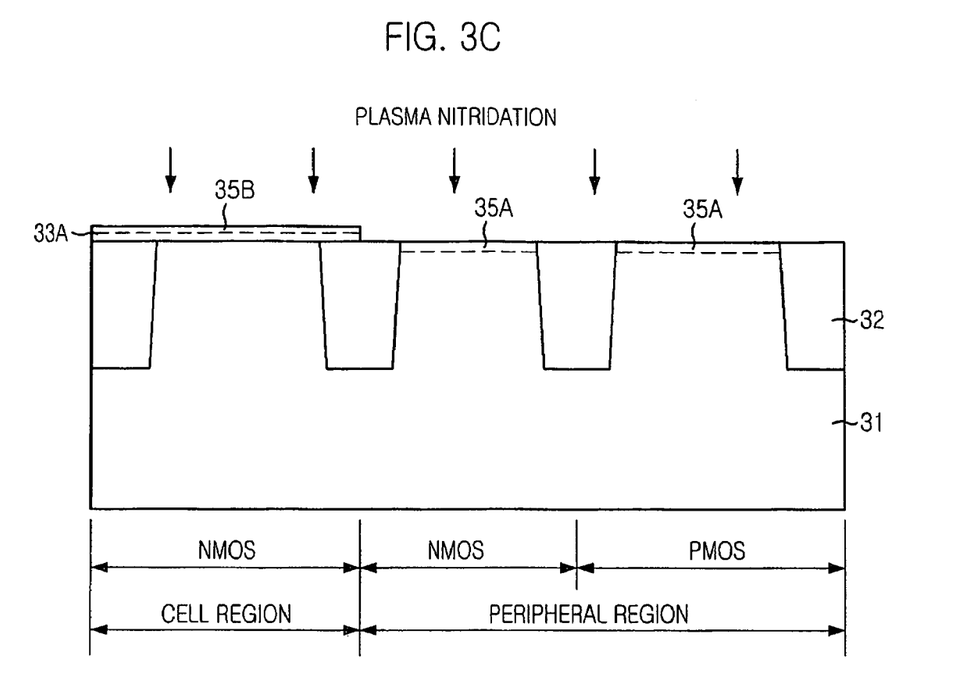

Referring to FIG. 3C, the first mask pattern 34 is removed, and then, a plasma nitridation process is performed to nitride a surface of the remaining first silicon oxide layer 33A in the cell region and a surface of the exposed silicon substrate 31 in the peripheral region. Through the plasma nitridation process, silicon-nitrogen (Si—N) bonds 35A are formed on the surface of the silicon substrate 31 in the peripheral region and silicon-oxygen-nitrogen (Si—O—N) bonds 35B are simultaneously formed on the surface of the remaining first silicon oxide layer 33A.

Herein, the plasma nitridation process proceeds by using one of a method for generating nitrogen plasma directly on the silicon substrate 31 and a method for generating nitrogen plasma first at a different place and then nitriding the silicon substrate 31 by applying only nitrogen radicals thereto. The latter method is called a remote plasma nitridation method.

For the above described plasma nitridation process, a source gas for generating the plasma is selected from a group consisting of $Ar/N_2$, $Xe/N_2$, $N_2$, NO, $N_2O$ and a mixture of these listed gases. At this time, a power for generating the plasma ranges from approximately 100 W to approximately 3,000 W, and the plasma nitridation process is carried out for approximately 5 seconds to approximately 600 seconds. Also, a temperature of the silicon substrate 31 is set to be in a range from approximately 0° C. to approximately 600° C., and a quantity of flowed source gas ranges from approximately 5 sccm (standard cubic centimeter per minute) to approximately 2,000 sccm.

Figure 3D:
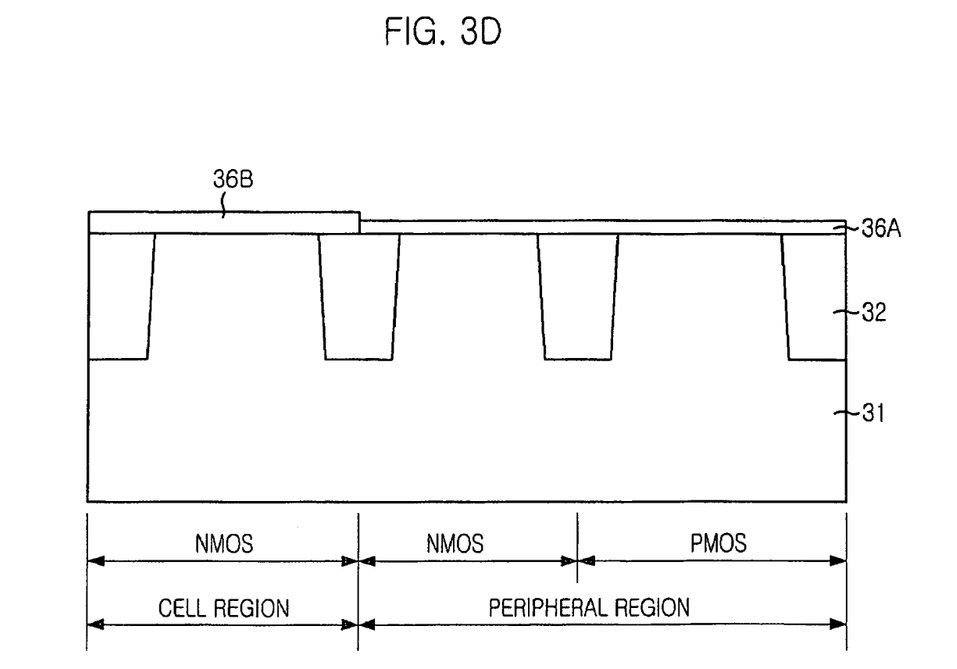

Referring to FIG. 3D, a second oxidation process, i.e., a re-oxidation process, is performed. At this time, on the surface of the silicon substrate 31 in the peripheral region on which the silicon-nitrogen bonds 35A are formed, an oxynitride layer 36A, more particularly, a silicon oxynitride (SiON) layer is formed as the portion of silicon substrate 31 on which the silicon-nitrogen bonds 35A are formed is exposed to an oxidizing ambient. Herein, the oxynitride layer 36A contains nitrogen of a concentration ranging in atomic percent from approximately 5% to approximately 30%.

However, the remaining silicon oxide layer 33A on which the silicon-oxygen-nitrogen bonds 35B are formed is transformed into a pure silicon oxide ($SiO_2$) layer as the nitrogen atoms of the silicon-oxygen-nitrogen bonds 35B are diffused out during the re-oxidation process. This transformation accompanies an increase in thickness. Eventually, the remaining first silicon oxide layer 33A in the cell region is transformed into a second silicon oxide layer 36B having a thickness greater than that of the remaining first silicon oxide layer 33A. Hereinafter, the second silicon oxide layer 36B is referred to as a targeted silicon oxide layer.

As a result of the re-oxidation process, the thickness of the oxynitride layer 36A is thinner than the targeted silicon oxide layer 36B because the nitrogen of the silicon-nitrogen bond 35A suppresses the oxidation during the re-oxidation process. In contrast, during the re-oxidation process, the nitrogen of the silicon-oxygen-nitrogen bond 35B is diffused out and thus, the suppression effect by the silicon-oxygen-nitrogen bond 35B is weaker than that by the silicon-nitrogen bond 35A. For this reason, during the concurrently applied re-oxidation process, the increase in the thickness of the targeted silicon oxide layer 36B is more pronounced than that of the oxynitride layer 35A.

Herein, since the silicon-nitrogen bond 35A has a stronger bonding force than that of the silicon-oxygen-nitrogen bond 35B, nitrogen of the silicon-nitrogen bond 35A barely diffuses out. Also, the remaining first silicon oxide layer 33A that is nitrided has a low level of resistance to the oxidation and as a result, the thickness of the nitrided remaining first silicon oxide layer 33A increases to a greater extent. On the other hand, the nitrided silicon substrate 31 has a high level of resistance to the oxidation and as a result, the increase in the thickness of the silicon substrate 31 is low.

Figure 3E:
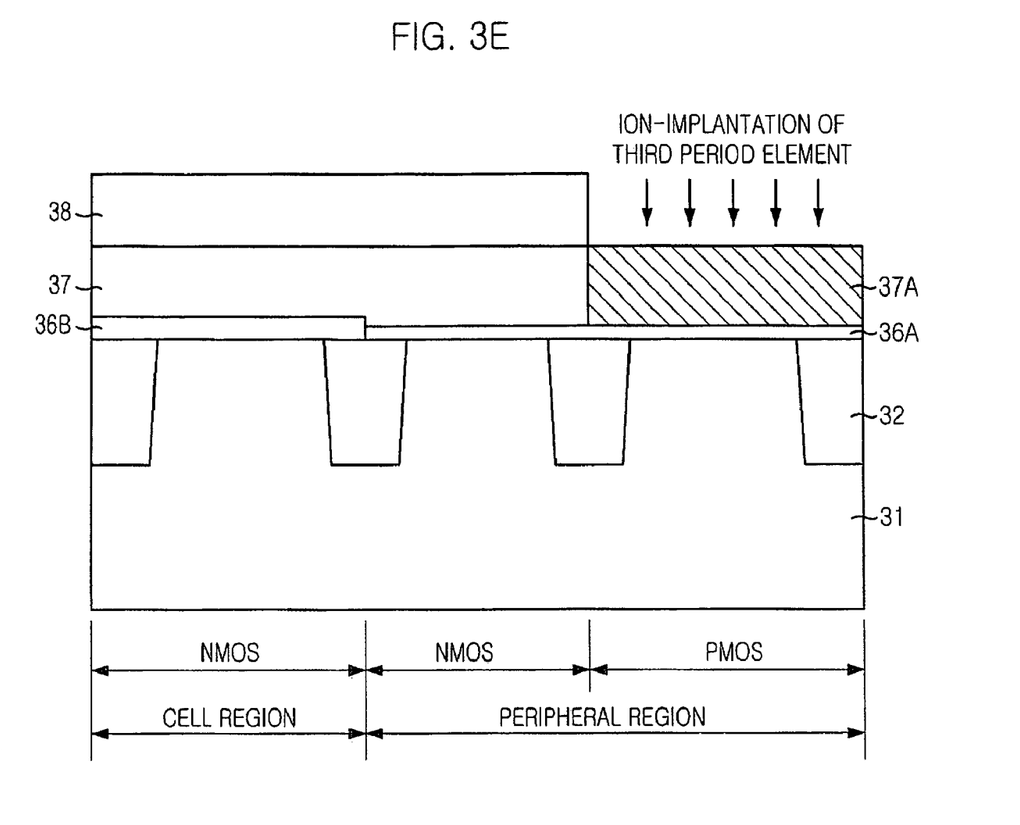

Referring to FIG. 3E, an undoped silicon layer 37 is formed on the oxynitride layer 36A and the targeted silicon oxide layer 36B. Afterwards, a photosensitive layer is formed on the undoped silicon layer 37 and is patterned by performing a photo-exposure process and a developing process to form a second mask pattern 38. Herein, the second mask pattern 38 masks the cell region and the NMOS region of the peripheral region while exposing the PMOS region of the peripheral region.

Next, dopants of an element in the third period, i.e., p-type dopants are ion-implanted by using the second mask pattern 38 as an ion implantation barrier. The dopant of the third period element is selected from a group consisting of boron (B), boron fluoride (BF) and boron difluoride ($BF_2$) The ion implantation is carried out by applying energy ranging from approximately 2 keV to approximately 30 keV and a dose of the dopants ranges from approximately $1\times10^{15}$ atoms/cm$^2$ to approximately $1\times10^{16}$ atoms/cm$^2$.

Especially, the ion implantation with the above mentioned dopants of the third period element is applied to the undoped silicon layer 37 disposed in the PMOS region of the peripheral region. Through the ion implantation process, the undoped silicon layer 37 in the PMOS region of the peripheral region is transformed to a p+-type silicon electrode 37A. Also, a portion of the undoped silicon layer 37 masked by the second mask pattern 38 is not transformed.

Figure 3F:
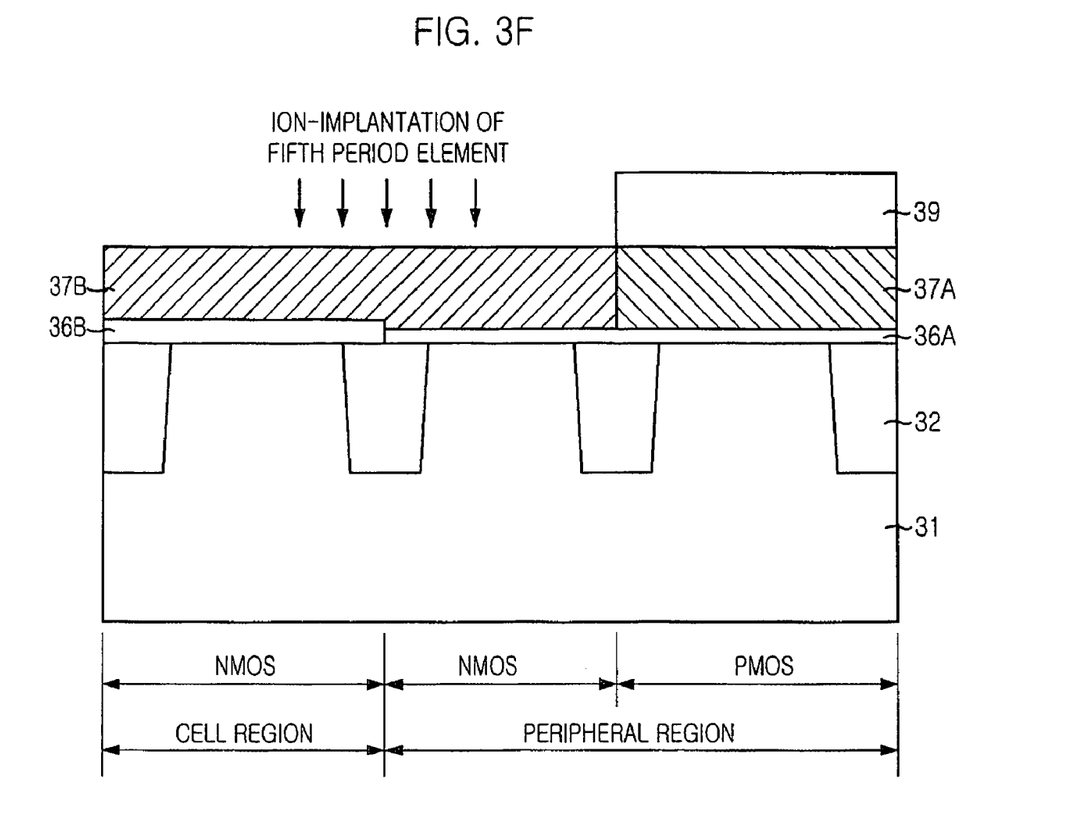

Referring to FIG. 3F, the second mask pattern 38 is removed, and then, a photosensitive layer is formed on the undoped silicon layer 37 and the p+-type silicon electrode 37A and is patterned by a photo-exposure process and a developing process to form a third mask pattern 39. Herein, the third mask pattern 39 masks the PMOS region of the peripheral region and exposes the cell region and the NMOS region of the peripheral region.

Subsequently, the undoped silicon layer 37 is subjected to an ion implantation process employing dopants of an element in the fifth period, i.e., n-type dopants. The fifth period element dopant is one of phosphorus (P) and arsenic (As). This ion implantation process is carried out with an energy ranging from approximately 3 keV to approximately 50 keV and a dose ranging from approximately $1\times10^{15}$ atoms/cm$^2$ to approximately $1\times10^{16}$ atoms/cm$^2$. As a result of this ion implantation process, the undoped silicon layer 37 disposed in the cell region and the NMOS region of the peripheral region is transformed into an n+-type silicon electrode 37B.

Figure 3G:
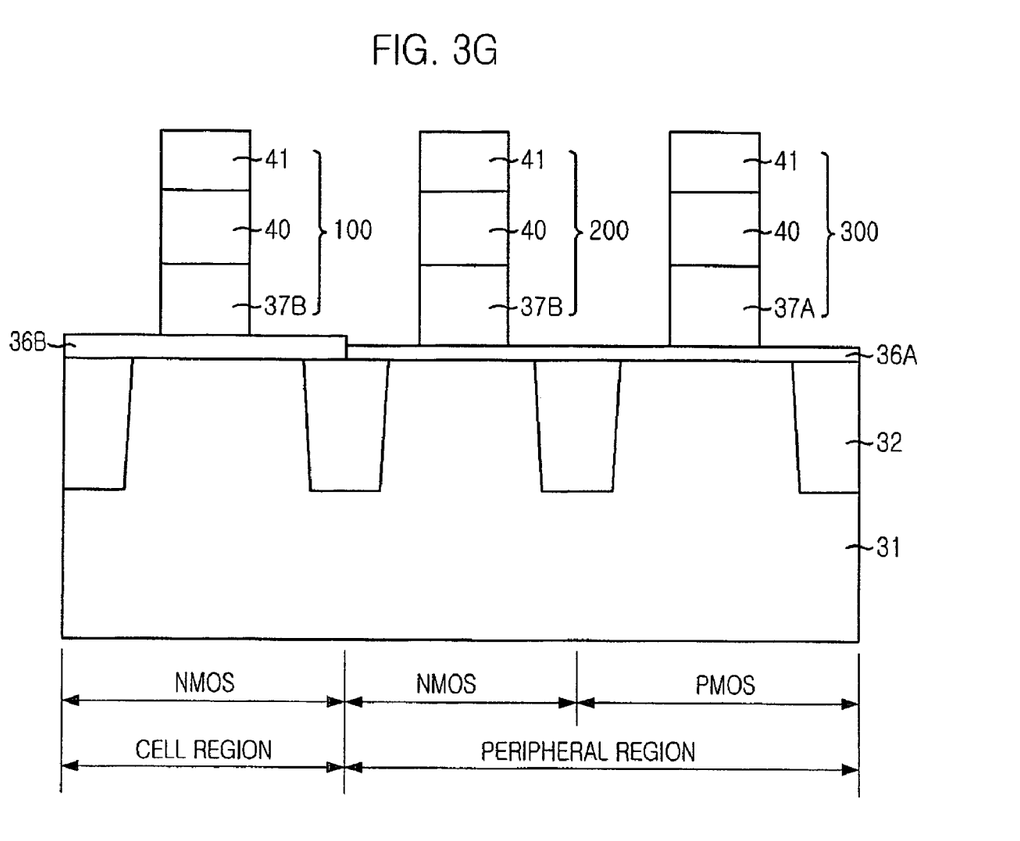

Referring to FIG. 3G, the third photosensitive pattern 39 is removed, and then, a low resistance metal electrode 40 and a gate hard mask 41 are sequentially formed on the p+-type silicon electrode 37A and the n+-type silicon electrode 37B. The low resistance metal electrode 40 is made of a material selected from a group consisting of tungsten, tungsten nitride and tungsten silicide. The gate hard mask 41 is made of nitride. Afterwards, a gate patterning process is performed to form a first to a third gate structures 100 to 300 in the cell region, the NMOS region of the peripheral region and the PMOS region of the peripheral region, respectively. Each of the first and the second gate structure 100 and 200 has a dual gate electrode structure including the n+-type silicon electrode 37B and the low resistance metal electrode 40. On the other hand, the third gate structure 300 formed in the PMOS region of the peripheral region has a dual gate electrode structure including the p+-type silicon electrode 37A and the low resistance metal electrode 40.

Figure 4:
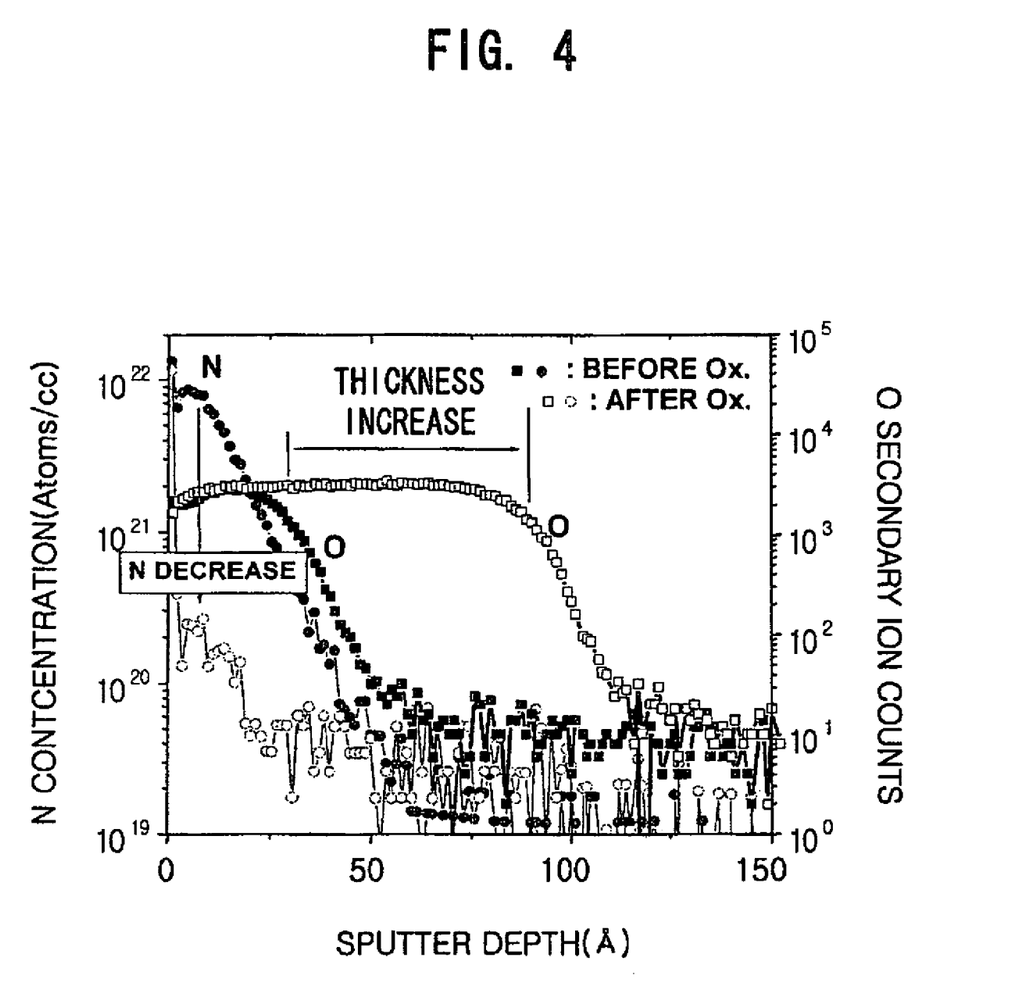
FIG. 4 is a graph showing changes in nitrogen and oxygen profiles when a silicon oxide layer is nitrided by a plasma nitridation technique and is re-oxidized thereafter consistent with the present invention.

FIG. 4 is a graph showing changes in oxygen and nitrogen profiles when a silicon oxide layer is nitrided through a plasma nitridation technique and is oxidized thereafter. Herein, reference denotations ○ and ● represent the nitrogen profiles, while reference denotations ■ and □ represent the oxygen profiles. Especially, the reference denotations of solid circles and squares, ● and ■, respectively represent the nitrogen profile and the oxygen profile before a re-oxidation process. Also, the reference denotations of open circles and squares, ○ and □, respectively represent the nitrogen profile and the oxygen profile after the re-oxidation process.

As shown in FIG. 4, a high level of nitrogen exists on a surface of the silicon oxide layer that is nitrided through the plasma nitridation technique. However, the nitrogen concentration decreases by the re-oxidation process.

For the oxygen profiles, the thickness of the silicon oxide layer increases by the re-oxidation process.

Consistent with the present invention, the NMOS transistor in the cell region uses the targeted silicon oxide layer 36B as a gate dielectric layer while the NMOS transistor and the PMOS transistor in the peripheral region use the oxynitride layer 36A as the gate dielectric layer which is thin. Therefore, it is possible to form dual gate dielectric layers with different thicknesses within one chip.

As mentioned above, the targeted silicon oxide layer 36B and the oxynitride layer 36A each having a different thickness can be selectively formed within one chip through simple processes such as the plasma nitridation process and the re-oxidation process. Thus, the NMOS transistor in the cell region requiring high sensitivity to carrier mobility and good reliability uses the targeted silicon oxide layer 36B as the gate dielectric layer, while the PMOS transistor in the peripheral region requiring high sensitivity to penetration of boron uses the oxynitride layer 36A as a gate dielectric layer.

For instance, in case of implementing this dual gate electric layer to DRAM devices, since the NMOS transistor in the cell region requires high sensitivity to the carrier mobility and good reliability, the thick targeted silicon oxide layer 36B is used as the gate dielectric layer. Also, the PMOS transistor in the peripheral region uses the oxynitride layer 36A as the gate dielectric layer to prevent the dopants of the third period element doped onto the p+-type silicon electrode 37A from penetrating into the gate dielectric layer.

Thus, consistent with the present invention, the selectively formed dual dielectric layers, i.e., the targeted silicon oxide layer and the oxynitride layer, provide an effect of securing intended levels of carrier mobility and reliability required in the transistor in the cell region and solving the boron penetration problem in the peripheral region. Also, the dual gate dielectric layers with different thicknesses provide another effect of realizing transistors usable for various purposes.

It will be apparent to those skilled in the art that various modifications and variations can be made in the disclosed process without departing from the scope or spirit of the invention. Other embodiments will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a semiconductor device, comprising the steps of:
    forming a silicon oxide layer on a silicon substrate divided into a cell region where NMOS transistors are formed and a peripheral region where NMOS and PMOS transistors are formed by performing a first oxidation process;
    selectively removing the silicon oxide layer in the peripheral region;
    performing a plasma nitridation process on an exposed surface of the silicon substrate in the peripheral region and a surface of the silicon oxide layer in the cell region, thereby forming silicon-nitrogen bonds on the surface of the silicon substrate in the peripheral region and silicon-oxygen-nitrogen bonds on the surface of the silicon oxide layer remaining in the cell region; and
    performing a second oxidation process to form an oxynitride layer on the surface of the silicon substrate with the silicon-nitrogen bonds and transform the remaining silicon oxide layer with the silicon-oxygen-nitrogen bonds into a targeted silicon oxide layer, thereby forming the oxynitride layer on the silicon substrate in the peripheral region and the targeted silicon oxide layer on the silicon substrate in the cell region, wherein the targeted silicon oxide layer is formed by diffusing nitrogen out of the silicon-oxygen-nitrogen bonds during the second oxidation process.

2. The method of claim 1, wherein the plasma nitridation process is carried out by employing one of a method for forming nitrogen plasma directly on top of the silicon substrate and the silicon oxide layer and a remote plasma nitridation method.

3. The method of claim 2, wherein:
    the plasma nitridation process is carried out by employing a source gas selected from a group consisting of $Ar/N_2$, $Xe/N_2$, $N_2$, $NO$, $N_2O$, and a mixture thereof for approximately 5 seconds to approximately 600 seconds, along with an applied power ranging from approximately 100 W to approximately 3,000 W, a temperature of the silicon substrate maintained in a range from approximately 0° C. to approximately 600° C. and a quantity of the flowed source gas ranging from approximately 5 sccm to approximately 2,000 sccm.

4. The method of claim 1, wherein the targeted silicon oxide layer is thicker than the oxynitride layer.

5. The method of claim 1, after the second oxidation process, further including the steps of:
    forming an undoped silicon layer on the targeted silicon oxide layer and the oxynitride layer,
    ion implanting P-type dopants onto a portion of the undoped silicon layer disposed in a PMOS region of the peripheral region to form a p+-type silicon electrode;
    ion implanting n-type dopants onto a remaining portion of the undoped silicon layer disposed in NMOS regions of the cell region and the peripheral region to form an n+-type silicon electrode;
    forming a low resistance metal electrode on the p+-type silicon electrode and the n+-type silicon electrode;
    forming a gate hard mask on the low resistance metal electrode; and
    patterning the gate hard mask, the low resistance metal electrode, the p+-type silicon electrode, and the n+-type silicon electrode to form gate structures.

6. The method of claim 1, wherein the silicon oxide layer formed through the first oxidation process has a thickness ranging from approximately 5 Å to approximately 100 Å.

7. The method of claim 1, wherein the targeted silicon oxide layer is thicker than the silicon oxide layer.

* * * * *